United States Patent [19]

Kasahara et al.

[11] Patent Number: 4,565,844
[45] Date of Patent: Jan. 21, 1986

[54] PROPYLENE-ETHYLENE BLOCK COPOLYMER COMPOSITION

[75] Inventors: Toshikazu Kasahara, Ichihara; Toshifumi Kajiya, Sodegaura; Tomio Akiyoshi, Ichihara, all of Japan

[73] Assignee: Idemitsu Petrochemical Co., Ltd., Tokyo, Japan

[21] Appl. No.: 653,509

[22] Filed: Sep. 21, 1984

[30] Foreign Application Priority Data

Oct. 12, 1983 [JP] Japan .................................. 58-190403

[51] Int. Cl.$^4$ ........................... C08K 3/34; C08K 5/10; C08K 5/15; C08L 23/16
[52] U.S. Cl. ..................................... 524/108; 524/288; 524/291; 524/394; 524/451; 524/505; 524/570; 524/776; 524/780; 524/786; 524/787; 524/788; 524/789
[58] Field of Search ............... 524/451, 570, 776, 780, 524/786–789, 505, 288, 394, 291, 108

[56] References Cited

U.S. PATENT DOCUMENTS

| | | | |
|---|---|---|---|
| 4,016,118 | 4/1977 | Hamada et al. | 524/108 |
| 4,111,898 | 9/1978 | Inayoshi et al. | 524/587 |
| 4,184,026 | 1/1980 | Carrock et al. | 524/288 |
| 4,275,168 | 6/1981 | Watanabe et al. | 521/149 |
| 4,338,228 | 7/1982 | Inoue et al. | 524/531 |
| 4,388,119 | 6/1983 | Uchiyama | 524/108 |
| 4,433,097 | 2/1984 | Tawada et al. | 524/834 |
| 4,439,567 | 3/1984 | Inoue et al. | 524/108 |
| 4,467,061 | 8/1984 | Yamamoto et al. | 524/299 |
| 4,483,952 | 11/1984 | Uchiyama | 524/108 |

FOREIGN PATENT DOCUMENTS

| | | | |
|---|---|---|---|
| 0092940 | 11/1983 | European Pat. Off. | 524/108 |
| 0117044 | 10/1978 | Japan | 524/108 |
| 0132049 | 11/1978 | Japan | 524/108 |
| 0030450 | 3/1981 | Japan | 524/108 |
| 0015544 | 1/1983 | Japan | 524/451 |
| 0025341 | 2/1983 | Japan | 524/451 |
| 0047044 | 3/1983 | Japan | 524/451 |
| 0129037 | 8/1983 | Japan | 524/451 |
| 0162652 | 9/1983 | Japan | 524/451 |
| 0147473 | 9/1983 | Japan | 524/108 |
| 0184238 | 10/1984 | Japan | 524/108 |

Primary Examiner—Herbert J. Lilling
Attorney, Agent, or Firm—Frishauf, Holtz, Goodman & Woodward

[57] ABSTRACT

The propylene-ethylene block copolymer composition of the invention is excellent in transparency as well as in stiffness and low temperature impact strength.

The copolymer composition of the present invention comprises (a) from 0.01 to 1.0 part by weight of a nucleating agent and (b) from 0.01 to 3.0 parts by weight of talc having an average particle size of not more than 10 microns, admixed in 100 parts by weight of propylene-ethylene block copolymer. Said propylene-ethylene block copolymer was formed in a multi-stage polymerization process wherein the ethylene content of the copolymer formed at the propylene-ethylene copolymerization stage is from 5 to 40% by weight based on the total polymerization amount of the copolymer formed at said propylene-ethylene copolymerization stage.

14 Claims, No Drawings

PROPYLENE-ETHYLENE BLOCK COPOLYMER COMPOSITION

BACKGROUND OF THE INVENTION

The present invention relates to a propylene-ethylene block copolymer composition.

Propylene-ethylene block copolymers are used as sheets, molded articles, and also as materials for production of car parts, home electric appliances, and so forth because they are superior in stiffness and low temperature impact strength. Because of poor transparency, however, they can find only limited applications. Thus, to increase the transparency of the copolymers, it has been proposed to add nucleating agents. In this case, a problem arises in that the low temperature impact strength drops. Furthermore, an attempt has been made to increase the low temperature impact strength of propylene-ethylene block copolymers in order to extend their applications by compounding inorganic filler such as talc. Addition of such inorganic filler, however, results in a decrease in transparency of the copolymers.

Thus it has been desired to improve the transparency of propylene-ethylene block copolymers without deteriorating their superior stiffness and low temperature impact strength or while at the same time more increasing the stiffness and low temperature impact strength.

SUMMARY OF THE INVENTION

An object of the present invention is to improve the transparency of propylene-ethylene block copolymers.

Another object of the present invention is to improve the transparency of propylene-ethylene block copolymers while at the same time increasing the stiffness and low temperature impact strength thereof.

Still another object of the present invention is to provide propylene-ethylene block copolymer composition having improved transparency.

It has been found that the above objects are attained by adding a nucleating agent and talc having a specified particle size each in a specific amount to the propylene-ethylene block copolymer. It has also been found that the objects are attained more efficiently when propylene-ethylene block copolymer having a specified composition is employed.

The present invention relates to propylene-ethylene block copolymer composition comprising propylene-ethylene block copolymer and 0.01 to 1.0 part by weight of a nucleating agent and 0.01 to 3.0 parts by weight of talc having an average particle size of not more than 10 microns, both being per 100 parts by weight of the propylene-ethylene block copolymer.

DETAILED DESCRIPTION OF THE INVENTION

Propylene-ethylene block copolymers as used herein can be produced by multi-stage polymerization in the presence of a so-called Ziegler catalyst. This multi-stage polymerization can be performed by various procedures, such as a method in which homopolymerization of propylene is carried out in the first stage and block copolymerization of propylene and ethylene is performed in the second stage to produce a propylene-ethylene block copolymer consisting of from 65 to 95 percent by weight or polypropylene having an intrinsic viscosity $[\eta]$ of from 1.0 to 3.0 and from 35 to 5 pecent by weight of propylene-ethylene copolymer having $[\eta]$ of 3.0 to 10.0, and a method in which homopolymerization of propylene is carried out in the first and second stages, and block copolymerization of propylene and ethylene, is performed in the third stage to produce a propylene-ethylene block copolymer consisting of from 50 to 94 percent by weight, preferably from 65 to 90 percent by weight of polypropylene having $[\eta]$ of from 0.5 to 3.5, preferably 0.7 to 3.0, from 3 to 25 percent by weight, preferably from 5 to 15 percent by weight of polypropylene having $[\eta]$ of 4.0 or more, preferably from 4.3 to 7.5 and from 3 to 25 percent by weight, preferably from 5 to 18 percent by weight of propylene-ethylene copolymer having $[\eta]$ of 3 or more, preferably from 3.0 to 10.0. Details of such methods of production are described in, for example, Japanese Patent Kokai Koho No. 120611/1984.

Propylene-ethylene block copolymers as produced under the known production conditions can be used in the present invention. Preferred are those copolymers in which the polymerization amount of ethylene at the stage of propylene-ethylene copolymerization is from 5 to 40 percent by weight based on the total polymerization amount of the copolymer at the same stage. If the ethylene content is too large, transparency is improved only insufficiently even if a nucleating agent is added. On the other hand, if it is too small, stiffness and low temperature impact strength are low and, even if a suitable additive is added, these physical properties cannot be improved sufficiently.

Known nucleating agents can be used in the present invention. Typical examples are alkyl-substituted benzoic acids or their derivatives or metallic salts thereof (e.g., p-tert-butylbenzoic acid, p-iso-propylbenzoic acid, o-tert-butylbenzoic acid or metalic salts thereof wherein metals such as lithium, sodium, magnesium, calcium, barium, aluminum, etc.), dibenzylidenesorbitols and their derivatives (e.g., 1,3,2,4-dibenzylidenesorbitol, 1,3,2,4-di(p-methylbenzylidene)sorbitol, 1,3,2,4-di(p-chlorobenzylidene)sorbitol, and 1,3,2,4-di(p-methoxybenzylidene)sorbitol), and sodium bis(4-tert-butylphenyl)phosphate. Among these compounds, aluminum p-tert-butylbenzoate is preferable. These nucleating agents are added to increase the stiffness and transparency of propylene-ethylene block copolymers. The amount of the nucleating agent added is from 0.01 to 1.0 part by weight, preferably from 0.04 to 0.4 part by weight per 100 parts by weight of the copolymer. If the amount of the nucleating agent added is less than 0.01 part by weight, the effect of addition of the nucleating agent can be obtained only insufficiently. On the other hand, if it is in excess of 1.0 part by weight, the corresponding effect cannot be obtained.

Talc is added for the purpose of increasing or maintaining the low temperature impact strength of propylene-ethylene block copolymers. It is preferred that the average particle size of talc be not more than 10 microns, preferably less than 3 microns, more preferably from 1.5 to 0.3 microns. If talc having an average particle size in excess of 10 microns is used, the transparency of the resulting copolymer composition is poor and, furthermore, its low temperature impact strength is decreased. The amount of talc added is from 0.01 to 3.0 parts by weight, preferably from 0.05 to 1.0 part by weight, more preferably from 0.08 to 0.8 part by weight per 100 parts by weight of the copolymer. If the amount of talc added is less than 0.01 part by weight, the effect of addition of talc can be obtained only insufficiently. On the other hand, if it is in excess of 3.0 parts by weight, the transparency of the resulting copolymer composition is poor.

In accordance with the present invention, the propylene-ethylene block copolymer is not only greatly improved in transparency, but also is very satisfactory in stiffness and low temperature impact strength. Thus it is extended in its application and can be used widely as sheet, molded articles, injection molded articles, and so forth. In particular, it is suitable for use in production of containers for frozen foodstuffs.

The present invention is described in greater detail with reference to the following examples.

PREPARATION EXAMPLE 1

In this example, propylene-ethylene block copolymer was produced.

Predetermined amounts of n-heptane, diethylaluminum chloride, and titanium trichloride were placed in an autoclave equipped with a stirrer.

First Stage Polymerization

Hydrogen was continuously introduced into the autoclave in such an amount as to produce polypropylene having a predetermined intrinsic viscosity, and also propylene was continuously introduced into the autoclave in such an amount that the reaction pressure was set to 9 kilograms per square centimeter. While maintaining the temperature of the reaction mixture at 65° C., propylene was polymerized for 90 minutes while stirring. Then, the unreacted propylene was removed and the temperature of the reaction mixture was lowered to 50° C.

Second Stage Polymerization

While maintaining the temperature at 50° C., calculated amounts of hydrogen and propylene were continuously introduced into the autoclave, and propylene was polymerized for 40 minutes.

Third Stage Polymerization

While maintaining the temperature at 50° C., propylene-ethylene mixture and a calculated amount of hydrogen were introduced into the autoclave, and polymerization was performed for 30 minutes. After the polymerization reaction was completed, the unreacted gases were removed. To the polymerization product was added n-butanol, and the resulting mixture was stirred at 65° C. for 1 hour to decompose the catalyst. The product was separated, washed and then dried to yield a white powdered propylene-ethylene block copolymer.

The intrinsic viscosity $[\eta]$ and amount of the polymer formed at each polymerization stage, and the ethylene content of the polymer formed at the third stage polymerization were measured. The results are shown in Table 1.

PREPARATION EXAMPLE 2

A white powdered polymer, propylene-ethylene block copolymer, was produced in the same manner as in Preparation Example 1 except that the following two stage polymerization method was employed.

First Stage Polymerization

Hydrogen was continuously introduced into the autoclave in such an amount as to produce polypropylene having a predetermined intrinsic viscosity, and also propylene was continuously introduced into the autoclave in such an amount that the reaction pressure was set to 9 kilograms per square centimeter. While maintaining the temperature of the reaction mixture at 65° C., propylene was polymerized for 90 minutes while stirring. Then, the unreacted propylene was removed and the temperature of the reaction mixture was lowered to 57° C.

Second Stage Polymerization

While maintaining the temperature at 57° C., propylene-ethylene mixture and a calculated amount of hydrogen were introduced, and polymerization was performed for 30 minutes. Then, the unreacted gases were removed. To the reaction product was added n-butanol, and the resulting mixture was stirred at 65° C. for 1 hour to decompose the catalyst.

The intrinsic viscosity and amount of the polymer formed at each polymerization stage, and the ethylene content of the polymer formed at the second stage polymerization were measured. The results are shown in Table 2.

TABLE 2

| | First Stage Polymerization | | Second Stage Polymerization | | |
|---|---|---|---|---|---|
| Run No. | Intrinsic Viscosity $[\eta]$ (dl/g) | Amount of Polymer (wt %) | Intrinsic Viscosity $[\eta]$ (dl/g) | Amount of Polymer (wt %) | Ethylene Content (wt %) |
| 5 | 1.4 | 86 | 4.2 | 14 | 29 |
| 6 | 1.1 | 85 | 4.6 | 15 | 30 |

EXAMPLES 1 TO 7, AND COMPARATIVE EXAMPLES 1 TO 9

To the powdered propylene-ethylene block copolymer produced in Preparation Example 1 were added predetermined amounts of a nucleating agent and talc. The resulting mixture was granulated in a uniaxial kneading extruder and then molded into a sheet having 0.4 millimeter in thickness by the use of a sheet molding machine. This sheet was measured for physical properties. The results are shown in Table 3.

TABLE 1

| | First Stage Polymerization | | Second Stage Polymerization | | Third Stage Polymerization | | |
|---|---|---|---|---|---|---|---|
| Run No. | Intrinsic Viscosity $[\eta]$ (dl/g) | Amount of Polymer (wt %) | Intrinsic Viscosity $[\eta]$ (dl/g) | Amount of Polymer (wt %) | Intrinsic Viscosity $[\eta]$ (dl/g) | Amount of Polymer (wt %) | Ethylene Content (wt %) |
| 1 | 2.5 | 79 | 4.6 | 10 | 4.2 | 11 | 23 |
| 2 | 2.4 | 68 | 4.7 | 20 | 3.3 | 12 | 13 |
| 3 | 2.4 | 75 | 7.2 | 13 | 5.8 | 9 | 38 |
| 4 | 2.2 | 78 | 4.4 | 8 | 5.3 | 14 | 62 |

EXAMPLES 8 TO 12, AND COMPARATIVE EXAMPLES 10 AND 11

Using the propylene-ethylene block copolymer produced in Preparation Example 2, a sheet was produced in the same manner as in the above Examples. This sheet was measured for physical properties. The results are shown in Table 3.

EXAMPLES 13 AND 14

The procedure of Example 1 was repeated except that talc having a particle size of $0.6\mu$ or $1.4\mu$ was used.

TABLE 3

| Run No. | Propylene-Ethylene Block Copolymer | | Nucleating Agent*4 | | Talc | | Physical Properties | | |
|---|---|---|---|---|---|---|---|---|---|
| | Amount of Copolymer Portion (wt %) | Ethylene Content of Copolymer Portion (wt %) | Type | Amount (parts by weight) | Particle Size ($\mu$) | Amount (parts by weight) | Haze*1 (%) | Falling*2 Ball Impact Value (kg·cm) | Tensile*3 Modulus (kg/cm²) |
| Example 1 | 11 | 23 | A | 0.06 | 0.8 | 0.2 | 50 | 11.0 | 16000 |
| Example 2 | 11 | 23 | B | 0.1 | 0.8 | 0.1 | 48 | 10.2 | 15500 |
| Example 3 | 11 | 23 | A | 0.06 | 0.8 | 0.5 | 52 | 12.4 | 16300 |
| Example 4 | 11 | 23 | B | 0.3 | 0.8 | 0.1 | 45 | 9.8 | 15800 |
| Example 5 | 12 | 13 | A | 0.06 | 0.8 | 0.2 | 40 | 9.8 | 15500 |
| Example 6 | 9 | 38 | A | 0.06 | 0.8 | 0.2 | 67 | 14.6 | 16000 |
| Example 7 | 11 | 23 | C | 0.2 | 0.8 | 0.2 | 47 | 9.5 | 15900 |
| Example 8 | 14 | 29 | A | 0.06 | 0.8 | 0.2 | 73 | 26.0 | 14700 |
| Example 9 | 14 | 29 | B | 0.1 | 0.8 | 0.2 | 69 | 25.8 | 14500 |
| Example 10 | 14 | 29 | C | 0.1 | 0.8 | 0.2 | 73 | 26.1 | 14400 |
| Example 11 | 15 | 30 | A | 0.06 | 0.8 | 0.3 | 84 | 30.4 | 14300 |
| Example 12 | 15 | 30 | C | 0.1 | 0.8 | 0.5 | 78 | 32.7 | 14400 |
| Example 13 | 11 | 23 | A | 0.06 | 0.6 | 0.2 | 48 | 11.1 | 16000 |
| Example 14 | 11 | 23 | A | 0.06 | 1.4 | 0.2 | 52 | 12.2 | 15800 |
| Comparative Example 1 | 11 | 23 | A | 0.06 | 15 | 0.2 | 71 | 9.8 | 16000 |
| Comparative Example 2 | 11 | 23 | A | 0.1 | | | 58 | 7.0 | 15600 |
| Comparative Example 3 | 11 | 23 | B | 0.3 | | | 50 | 8.0 | 15800 |
| Comparative Example 4 | 11 | 23 | | | 0.8 | 0.2 | 61 | 11.2 | 14000 |
| Comparative Example 5 | 14 | 62 | A | 0.06 | 0.8 | 0.2 | 87 | 46.1 | 14500 |
| Comparative Example 6 | 11 | 23 | | | | | 64 | 9.5 | 13300 |
| Comparative Example 7 | 12 | 13 | | | | | 60 | 6.8 | 13000 |
| Comparative Example 8 | 9 | 38 | | | | | 69 | 13.4 | 13800 |
| Comparative Example 9 | 14 | 62 | | | | | 87 | 34.7 | 12300 |
| Comparative Example 10 | 14 | 29 | | | | | 85 | 22.5 | 12000 |
| Comparative Example 11 | 15 | 30 | | | | | 82 | 25.4 | 11800 |

Note:
*1Measured according to JIS K-7105.
*2Measured at $-20°$ C. according to JIS K-7211.
*3Measured according to JIS K-7113.
*4A: aluminum p-tert-butylbenzoate
B: 1,3,2,4-dibenzylidenesorbitol
C: sodium bis(4-tert-butylphenyl)phosphate

What is claimed is:

1. A transparent propylene-ethylene block copolymer composition having low haze comprising (a) from 0.01 to 1.0 part by weight of a nucleating agent and (b) from 0.01 to 3.0 parts by weight of talc having an average particle size of not more than 10 microns, admixed in 100 parts by weight of propylene-ethylene block copolymer; said proylene-ethylene block copolymer having been formed in a multi-stage polymerization process wherein the ethylene content of the copolymer formed at the propylene-ethylene copolymerization stage of said multi-stage polymerization process is from 5 to 40 percent by weight based on the total polymerization amount of the copolymer formed at said propylene-ethylene copolymerization stage.

2. The composition as claimed in claim 1, wherein the nucleating agent is a compound selected from the group consisting of metallic salt of alkyl-substituted benzoic acid and dibenzylidenesorbitol.

3. The composition as claimed in claim 1, wherein the amount of the nucleating agent is from 0.04 to 0.4 part by weight per 100 parts by weight of the copolymer.

4. The composition as claimed in claim 1, wherein the talc is a talc having an average particle size of less than 3 microns.

5. The composition as claimed in claim 1, wherein the amount of the talc is from 0.05 to 1.0 part by weight per 100 parts by weight of the copolymer.

6. The composition as claimed in claim 3, wherein the talc is a talc having an average particle size of less than 3 microns and the amount of the talc is from 0.05 to 1.0 part by weight per 100 parts by weight of the copolymer.

7. The composition as claimed in claim 6, wherein the nucleating agent is a compound selected from the group consisting of metallic salt of alkyl-substituted benzoic acid and dibenzylidenesorbitol.

8. The composition as claimed in claim 1, wherein said propylene-ethylene block copolymer was formed in a two stage process wherein propylene was homopolymerized in the first stage and propylene and ethylene were block copolymerized in the second stage to produce a propylene-ethylene block copolymer consisting essentially of from 65 to 95 percent by weight of polypropylene having an intrinsic viscosity $[\eta]$ of from 1.0 to 3.0 and from 35 to 5 percent by weight of propylene-ethylene copolymer having $[\eta]$ of 3.0 to 10.0

9. The composition as claimed in claim 1, wherein said propylene-ethylene block copolymer was formed in a three stage process wherein propylene was homopolymerized in the first and second stages and propylene and ethylene were block copolymerized in the third stage to produce a propylene-ethylene block copolymer consisting essentially of from 50 to 94 percent by weight, polypropylene having $[\eta]$ of from 0.5 to 3.5, from 3 to 25 percent by weight, of polypropylene having $[\eta]$ of 4.0 or more, and from 3 to 25 percent by weight, of propylene-ethylene copolymer having $[\eta]$ of 3 more.

10. The composition as claimed in claim 3, wherein the talc is a talc having an average particle size of from 0.3 to 1.5 microns and said talc is in an amount of from 0.08 to 0.8 part by weight per 100 parts by weight of the copolymer.

11. The composition as claimed in claim 10, wherein said propylene-ethylene block copolymer was formed in a two stage process wherein propylene was homopolymerized in the first stage and propylene and ethylene were block copolymerized in the second stage to produce a propylene-ethylene block copolymer consisting essentially of from 65 to 95 percent by weight of polypropylene having an intrinsic viscosity $[\eta]$ of from 1.0 to 3.0 and from 35 to 5 percent by weight of propylene-ethylene copolymer having $[\eta]$ of 3.0 to 10.0.

12. The composition as claimed in claim 11, wherein the nucleating agent is a compound selected from the group consisting of metallic salt of alkyl-substituted benzoic acid and dibenzylidenesorbitol.

13. The composition as claimed in claim 10, wherein said propylene-ethylene block copolymer was formed in a three stage process wherein propylene was homopolymerized in the first and second stages and propylene and ethylene were block copolymerized in the third stage to produce a propylene-ethylene block copolymer consisting essentially of from 65 to 90 percent by weight of polypropylene having $[\eta]$ of from 0.7 to 3.0, from 5 to 15 percent by weight of polypropylene having $[\eta]$ of from 4.3 to 7.5 and from 5 to 18 percent by weight of propylene-ethylene copolymer having $[\eta]$ of from 3.0 to 10.0

14. The composition as claimed in claim 13, wherein the nucleating agent is a compound selected from the group consisting of metallic salt of alkyl-substituted benzoic acid and debenzylidenesorbitol.

* * * * *